United States Patent
Ho et al.

(10) Patent No.: US 8,278,732 B1
(45) Date of Patent: Oct. 2, 2012

(54) ANTIFUSE ELEMENT FOR INTEGRATED CIRCUIT DEVICE

(75) Inventors: Jar-Ming Ho, Taoyuan County (TW); Yi-Nan Chen, Taoyuan County (TW); Hsien-Wen Liu, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 13/096,995

(22) Filed: Apr. 28, 2011

(51) Int. Cl.
*H01L 23/52* (2006.01)
(52) U.S. Cl. .................. 257/530; 257/E23.147
(58) Field of Classification Search .......... 257/50, 257/530, E23.147; 438/131, 467, 600
See application file for complete search history.

(56) References Cited

U.S. PATENT DOCUMENTS

| | | | |
|---|---|---|---|
| 5,163,180 A | 11/1992 | Eltoukhy et al. | |
| 6,627,970 B2 * | 9/2003 | Fuller et al. | 257/530 |

* cited by examiner

*Primary Examiner* — Victor A Mandala
*Assistant Examiner* — Selim Ahmed

(57) ABSTRACT

An antifuse element for an integrated circuit is provided, including a conductive region formed in a semiconductor substrate, extending along a first direction; a dielectric layer formed on a portion of the conductive region; a first conductive plug formed on the dielectric layer; a second conductive plug formed on another portion of the conductive region; and a first conductive member formed over the first and second conductive plugs, extending along a second direction perpendicular to the first direction; and a second conductive member formed over the second conductive plug extending along the second direction, wherein the first conductive member intersects with the conductive region, having a first overlapping area therebetween, and the dielectric layer and the conductive region have a second overlapping area therebetween, and a ratio between the first overlapping area and the second overlapping area is about 1.5:1 to 3:1.

10 Claims, 3 Drawing Sheets

ANTIFUSE ELEMENT FOR INTEGRATED CIRCUIT DEVICE

BACKGROUND OF THE INVENTION

1. Field of the Invention

The present invention relates to integrated circuit (IC) technology, and in particular, relates to an electrical-programmable antifuse element for integrated circuit (IC) devices.

2. Description of the Related Art

Integrated circuit (IC) devices are usually made with all internal connections set during the manufacturing process. However, due to high development costs, long manufacturing times, and high manufacturing tooling costs for forming such integrated circuits, users often desire circuits which can be configured or programmed in the field. Such circuits are called programmable circuits and they usually contain programmable links. Programmable links are electrical interconnects which are either broken or created at selected electronic nodes by the user after the integrated circuit device has been fabricated and packaged in order to activate or deactivate respective selected electronic nodes.

One type of the programmable links is a fuse element. The programmable links in the IC devices are programmed by blowing the fuse element at selected cross-over points to create an open circuit. The combination of blown and unblown links represents a digital bit pattern of ones and zeros signifying data which the user wishes to store in the IC device.

In addition, another type of programmable link is an antifuse element and has been developed for integrated-circuit devices. Instead of the programming mechanism causing an open circuit in the case with fuse elements, the programming mechanism in the antifuse element creates a short circuit or a relatively low resistance link therein.

As shown in FIG. 1, U.S. Pat. No. 5,163,180 discloses a conventional antifuse 10 with a structure as a conventional transistor. The antifuse 10 comprises a silicon substrate 12 of a first conductivity type, a gate dielectric layer 14 formed over the silicon substrate 12, a gate 16 formed on the gate dielectric layer 14, first and second regions 18 and 20 of a second conductivity type, spacers 22 and 24 formed at the edges of the gate 16, third and fourth regions 26 and 28 of the second conductivity type, an insulating region 30 formed over the silicon substrate 12, contacts 32 and 34 formed in the insulating region 30 to regions 26 and 28, and a contact 36 formed in the insulating region 30 formed to the gate 16.

Before programming, the antifuse 10 is an open circuit, wherein a resistance between the gate 16 and the regions 18, 20, 26, and 28 in the silicon substrate 12 is higher than $1 \times 10^9$ ohms. A low resistance filament 38 may be formed between the regions 20 and/or 28 and the gate 16 by applying a programming voltage in the range of 8-16 volts on the region 28 with respect to the substrate, with the region 26 held at the substrate potential while the gate 16 is grounded or biased at a slightly positive voltage, i.e., a voltage in the approximate range of 0-2 volts, with respect to the substrate.

The antifuse 10 shown in FIG. 1 can be programmed by a grounding region 26, a holding gate electrode 16 at a low voltage such as 2 volts, and placing a high voltage of approximately 12 volts on the region 28. All voltages are measured with respect to the substrate 12. Under these conditions, the device will be brought into a snap-back breakdown. Snap-back breakdown is a well known phenomenon, characterized in the structure of FIG. 1 by turning on of the parasitic NPN bipolar transistor having regions 18 and 26 as its emitter, substrate 12 as its base, and regions 20 and 28 as its collector. Snap-back breakdown is further characterized by a rise in the current flowing into regions 20 and 28 and by a high-electric-field existing at or near the junction between the regions 20 and 28 and the substrate 12. The combination of high current density and high electric field results in the generation of holes through avalanche-impact ionization and subsequent acceleration of these holes. Some of the energetic holes (or hot holes as they are commonly called) are injected into the dielectric 14. It is known that hole injection into a dielectric such as $SiO_2$ causes or accelerates the dielectric breakdown process.

Under the snap-back breakdown condition, the dielectric 14 in the antifuse of FIG. 1 can be broken down in milliseconds or a shorter time. After breakdown, the contact 36 will be electrically connected to the contact 34 through gate 16, with an ohmic connection through the rupture in the dielectric 14 located over regions 20 and/or 28. Thus, the antifuse 10 is programmed.

However, the antifuse 10 disclosed in U.S. Pat. No. 5,163,180 has a complex structure and occupies a great footprint over the substrate 12. In addition, a high current density and a high electric field are needed to program the antifuse 10. The above drawbacks are not desired while sizes and device densities of an integrated circuit are further decreased.

BRIEF SUMMARY OF THE INVENTION

An antifuse element for an integrated circuit device comprises a conductive region formed in a semiconductor substrate, extending along a first direction; a dielectric layer formed on a portion of the conductive region; a first conductive plug formed on the dielectric layer; a second conductive plug formed on another portion of the conductive region; and a first conductive member formed over the first and second conductive plugs, extending along a second direction perpendicular to the first direction; and a second conductive member formed over the second conductive plug extending along the second direction, wherein the first conductive member intersects with the conductive region, having a first overlapping area therebetween, and the dielectric layer and the conductive region have a second overlapping area therebetween, and a ratio between the first overlapping area and the second overlapping area is about 1.5:1 to 3:1

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
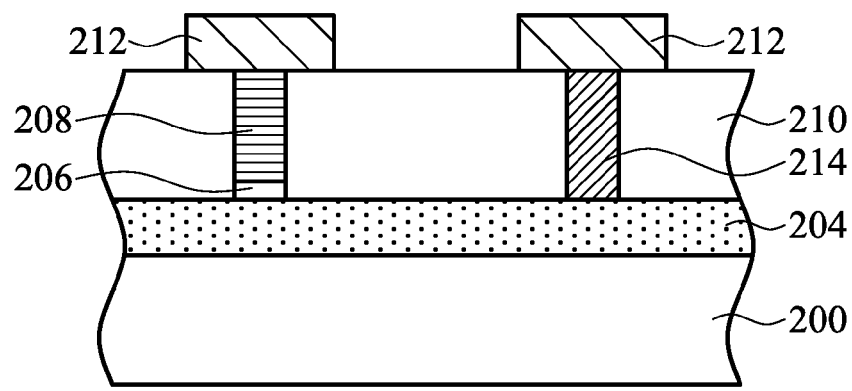
FIG. 2 is a cross section showing an antifuse element for an integrated circuit device according to an embodiment of the invention.

In FIG. 2, an exemplary antifuse element for an integrated circuit (IC) device is illustrated, comprising a semiconductor substrate 200, a conductive region 204 formed in a portion of the semiconductor substrate 200, an interlayer dielectric layer 210 formed over the semiconductor substrate 200, a conductive plug 208 and a dielectric layer 206 formed in the interlayer dielectric layer 210, a conductive plug 214 formed in the interlayer dielectric layer 210, and two conductive members 212 formed over the interlayer dielectric layer 210, respectively covering the conductive plug 208 and the conductive plug 214 formed in the dielectric layer 210.

In one embodiment, the semiconductor substrate 200 can be, for example, a silicon substrate having a first conductivity such as a P-type conductivity. A plurality of isolation structures 202 (see FIGS. 3 and 4) such as shallow trench isolation (STI) structures can be formed in the semiconductor substrate 200, thereby defining the conductive region 204. The conductive region 204 can be, for example, a region with a second conductivity different from the first conductivity of the semiconductor substrate 200, such as an N-typed doped region with a doping concentration of about 1E17-1E19 atoms/cm$^2$. In one embodiment, the conductive region 204 may function as an active area for devices or antifuses of an integrated circuit.

The conductive plugs 208 and 214 are formed over various portions of the conductive region 204 and are electrically isolated from each other by the interlayer dielectric layer 210. The dielectric layer 206 and the conductive plug 208 shown in FIG. 2 can be formed during formation of, for example, a gate oxide and a gate electrode of a gate structure, and the interlayer dielectric layer 210 can be sequentially formed to surround the dielectric layer 206 and the conductive plug 208. The conductive plug 214 shown in FIG. 2 can be formed during formation of, for example, a conductive contact, and can be formed after formation of the interlayer dielectric layer 210. The dielectric layer 206 may comprise silicon oxide and may have a thickness of about 2-3 nm. The conductive plug 208 may comprise doped polysilicon and may have a thickness of about 150-200 nm. The conductive plug 214 may comprise n-type doped silicon or tungsten (W) and may have a thickness of about 50-200 nm. The interlayer dielectric layer 210 may comprise BSG, PSG or BPSG. The conductive members 212 formed over the interlayer dielectric layer 210 can be, for example, the lowest conductive lines and may have a thickness of about 10-50 nm and may comprise tungsten.

Figure 3:
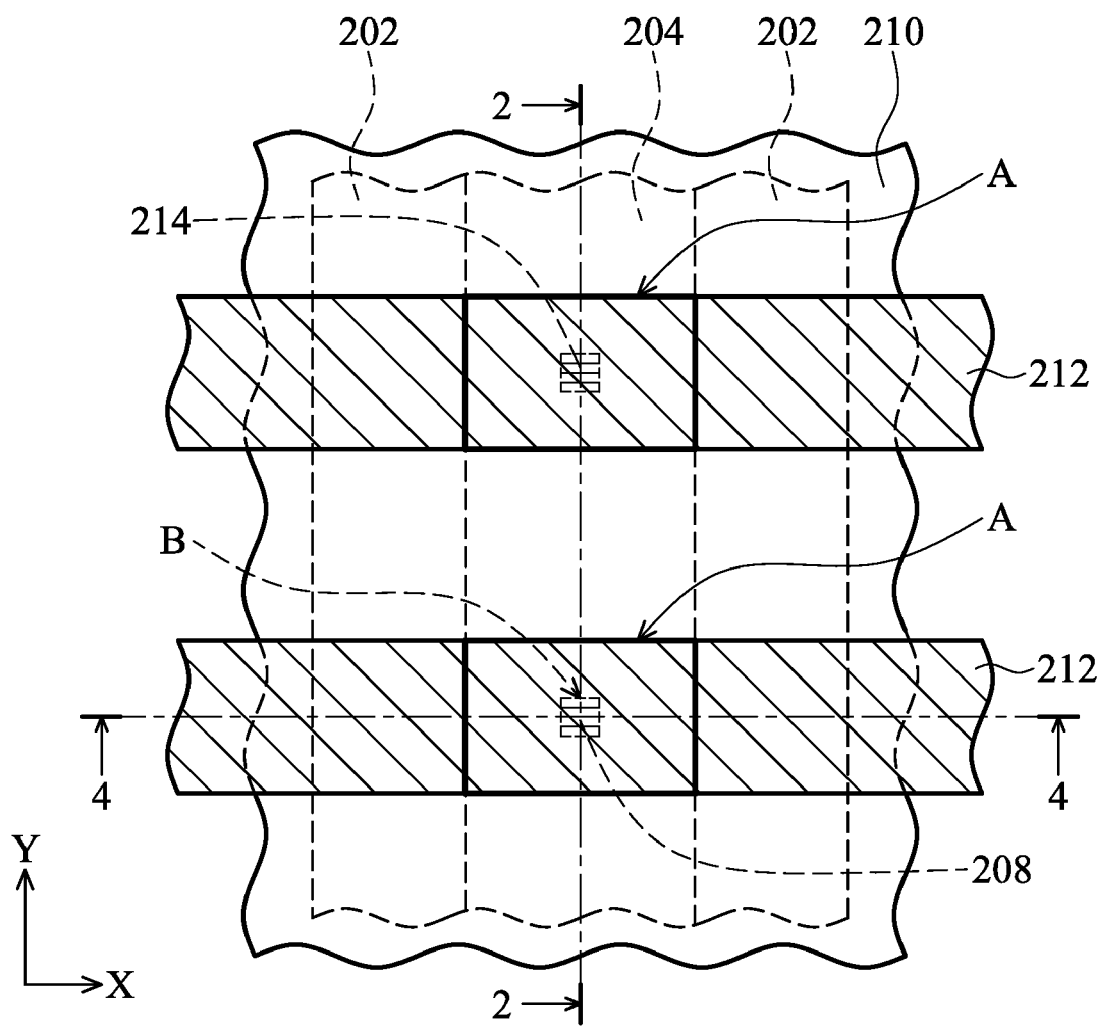
FIG. 3 is a top view of the antifuse element shown in FIG. 2.

FIG. 3 shows a top view of the antifuse element shown in FIG. 2. As shown in FIG. 3, the conductive region 204 is formed as a strip-like configuration extending over the semiconductor substrate 200 along a first direction, such as the direction Y shown in FIG. 3. The conductive members 212 are formed as a strip-like configuration extending over the interlayer dielectric layer 210 along a second direction, such as the direction X shown in FIG. 3. Thus, the conductive members 212 respectively intersect the conductive region 204, thereby having an overlapping region A therebetween. In addition, since the conductive plug 208 is formed over a portion of the conductive region 204 and the dielectric layer 206 is formed between the conductive plug 208 and the conductive region 204 such that an overlapping region B thus exits between the dielectric layer 206 and the conductive region 204. In one embodiment, the overlapping region A and the overlapping area B have a ratio of about 1.5:1 to 3:1 therebetween based on the purpose for programming the antifuse element as shown in FIG. 2.

Figure 4:
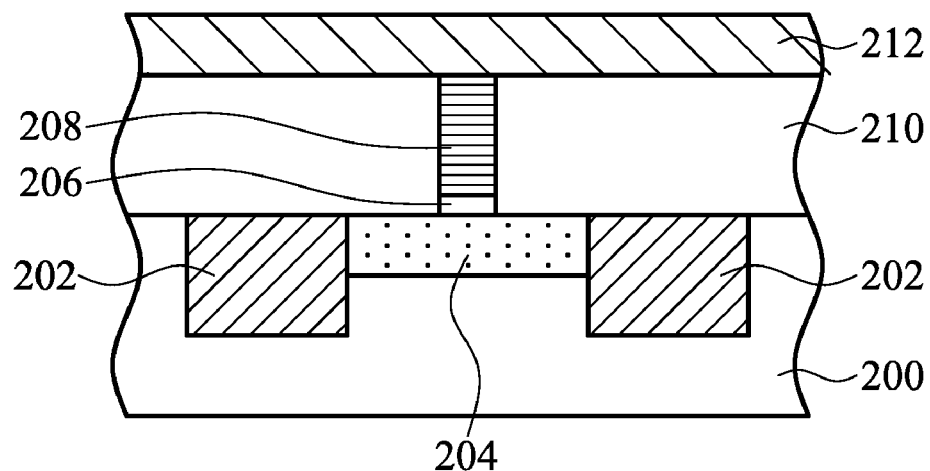
FIG. 4 is a cross section of the antifuse element shown in FIG. 3 taken along line 4-4 therein.

FIG. 4 is a cross section showing the antifuse element along a line 4-4 in FIG. 3. In FIG. 4, only the conductive plug 208 and the dielectric layer 206 formed over the semiconductor substrate 200 are shown. Moreover, the conductive plug 208 and the dielectric layer 206 are formed over the conductive region 204 defined in the semiconductor substrate 200 by two adjacent isolation structures 202.

Figure 5:
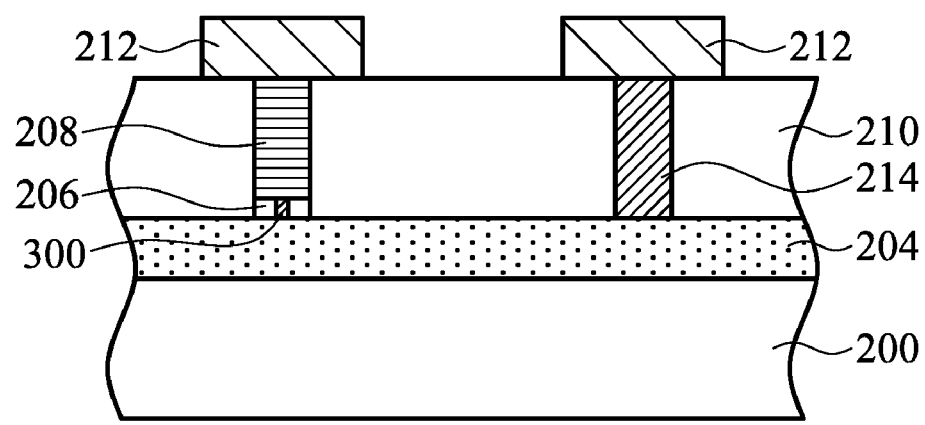
FIG. 5 is a cross section showing the antifuse element shown in FIG. 2 after programming thereof.

FIG. 5 is a cross section showing the antifuse element shown in FIG. 2 after programming thereof. During programming (not shown) of the antifuse element shown in FIG. 2, a programming voltage is provided to the conductive member 212 formed over the conductive plug 208 in a range of 4-6 volts and the conductive member 212 formed over the conductive plug 214 is grounded or being held at the substrate potential. Thus, one or more conductive filaments 300 can be thus formed in the dielectric layer 206 by electro-migration of the materials of the conductive plug 208 into the dielectric layer 206 to thereby cause an open circuit formed in the integrated circuit device into a short circuit. The conductive member 212 formed over the conductive plug 208 thus electrically connects the conductive region 204 by the conductive plug 208 and the conductive filaments 300 formed in the dielectric layer 206 and changes a digital bit pattern of ones and zeros signifying data which the user wishes to store in the IC device.

Figure 1:
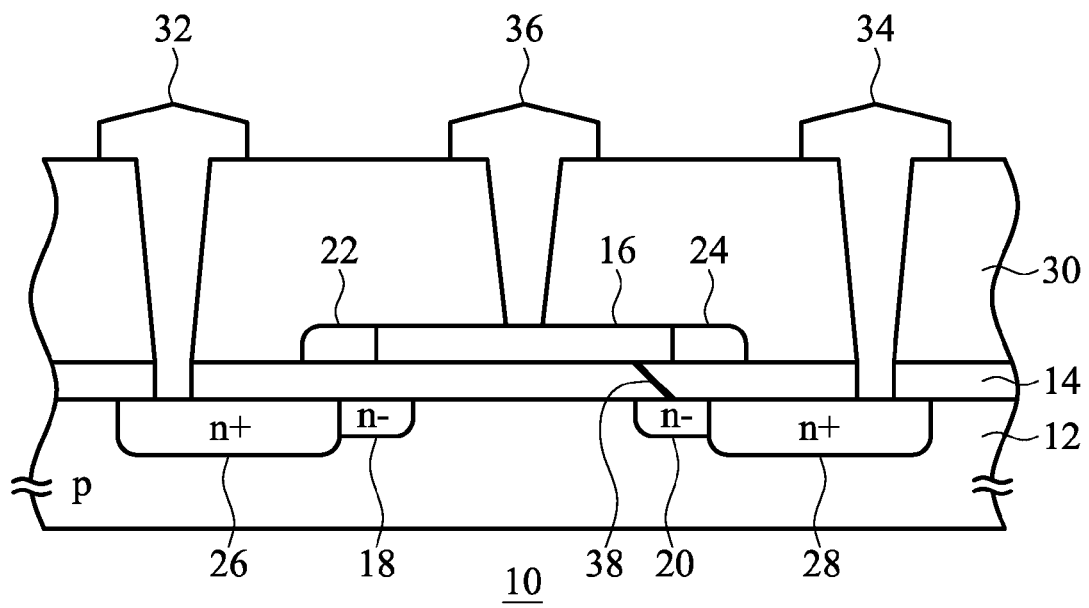
FIG. 1 is a cross section showing a conventional antifuse.

In the antifuse element illustrated in FIGS. 2-4, a programming voltage applied to the conductive member 212 formed over the conductive plug 208 is reduced and relatively low when compared to the programming voltage of the transistor type antifuse element shown in FIG. 1. In addition, the antifuse element illustrated in FIGS. 2-4 has a simplified configuration and occupies less footprints over the semiconductor substrate 200 when compared to the transistor type antifuse element shown in FIG. 1. These advantages of the antifuse element illustrated in FIGS. 2-4 are desired when a size of the integrated circuit device is further decreased.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An antifuse element for an integrated circuit device, comprising:
    a conductive region formed in a semiconductor substrate, extending along a first direction;
    a dielectric layer formed on a portion of the conductive region;
    a first conductive plug formed on the dielectric layer;
    a second conductive plug formed on another portion of the conductive region;
    a first conductive member formed over the first conductive plug, extending along a second direction perpendicular to the first direction; and
    a second conductive member formed over the second conductive plug extending along the second direction, wherein the first conductive member intersects with the conductive region, having a first overlapping area therebetween, and the dielectric layer and the conductive region have a second overlapping area therebetween, and a ratio between the first overlapping area and the second overlapping area is about 1.5:1 to 3:1.

2. The antifuse element as claimed in claim 1, wherein the semiconductor substrate is a P-type silicon substrate and the conductive region is doped with N-type dopants of a concentration of about 1E17-1E19 atoms/cm$^2$.

3. The antifuse element as claimed in claim 1, wherein the first conductive plug comprises doped polysilicon.

4. The antifuse element as claimed in claim 1, wherein the first and second conductive members comprise tungsten.

5. The antifuse element as claimed in claim 1, wherein the first and second conductive members are the lowest conductive lines formed over the semiconductor substrate.

6. The antifuse element as claimed in claim 1, wherein the dielectric layer comprises silicon oxide.

7. The antifuse element as claimed in claim 1, wherein the dielectric layer has a thickness of about 2-3 nm.

8. The antifuse element as claimed in claim 1, further comprising a plurality of isolation structures formed in the semiconductor substrate for defining the conductive region therein.

9. The antifuse element as claimed in claim 8, wherein the isolation structures are shallow trench isolation structures.

10. The antifuse element as claimed in claim 1, wherein the dielectric layer and the first conductive plug have a same surface area over the semiconductor substrate.

* * * * *